United States Patent
Lewis et al.

(10) Patent No.: US 7,561,990 B2
(45) Date of Patent: Jul. 14, 2009

(54) INTERACTIVE TRIANGULATED IRREGULAR NETWORK (TIN) SURFACES DESIGN

(75) Inventors: John M. Lewis, Acton, MA (US); Thomas M. Inzinga, Henniker, NH (US); Edward James Connor, Manchester, NH (US)

(73) Assignee: Autodesk, Inc., San Rafael, CA (US)

( * ) Notice: Subject to any disclaimer, the term of this patent is extended or adjusted under 35 U.S.C. 154(b) by 614 days.

(21) Appl. No.: 10/953,934

(22) Filed: Sep. 29, 2004

(65) Prior Publication Data

US 2005/0078110 A1     Apr. 14, 2005

Related U.S. Application Data

(60) Provisional application No. 60/507,080, filed on Sep. 29, 2003, provisional application No. 60/507,062, filed on Sep. 29, 2003, provisional application No. 60/506,975, filed on Sep. 29, 2003, provisional application No. 60/506,974, filed on Sep. 29, 2003.

(51) Int. Cl.
*G06F 17/50* (2006.01)
*G06K 9/42* (2006.01)

(52) U.S. Cl. .............................. 703/1; 382/256; 715/964

(58) Field of Classification Search ................ 703/1, 703/2; 345/582, 585, 420, 418, 619; 382/256; 715/964

See application file for complete search history.

(56) References Cited

U.S. PATENT DOCUMENTS

| | | | |
|---|---|---|---|
| 5,329,464 A | 7/1994 | Sumic et al. | |
| 5,357,428 A | 10/1994 | Stone, Jr. | |
| 5,553,211 A | 9/1996 | Uotani | |
| 5,555,354 A | 9/1996 | Strasnick et al. | |
| 5,838,634 A | 11/1998 | Jones et al. | |
| 6,259,451 B1 | 7/2001 | Tesler | |
| 6,313,837 B1 * | 11/2001 | Assa et al. | 345/420 |
| 6,654,690 B2 | 11/2003 | Rahmes et al. | |
| 6,721,694 B1 | 4/2004 | Lambrecht et al. | |
| 6,732,120 B1 | 5/2004 | Du | |
| 6,748,327 B1 | 6/2004 | Watson | |
| 6,757,445 B1 * | 6/2004 | Knopp | 382/285 |

(Continued)

OTHER PUBLICATIONS

C. M. Gold. Applications of dynamic voronoi data structures. In Oral Presentation, Second European Conference on Geographic Information Systems, Brussels, Belgium, © 1991. http://www.voronoi.com/pdfs/1990-1994/application_of_dynamic_voronoi_data_structures.pdf. Printed May 28, 2007.*

(Continued)

*Primary Examiner*—Paul L Rodriguez
*Assistant Examiner*—J Ochoa
(74) *Attorney, Agent, or Firm*—Gates & Cooper LLP

(57) ABSTRACT

A method, apparatus, and article of manufacture provide the ability to update a drawing surface in a CAD/GIS computer application. First, a drawing surface is displayed in a CAD/GIS application. A surface edit operation is then performed on the drawing surface. The CAD/GIS application then determines if an automatic rebuild option is active. If the rebuild option is active, the drawing surface is dynamically and automatically rebuilt to reflect the surface edit operation. Alternatively, if the automatic rebuild option is inactive (e.g., toggled off), the drawing surface is flagged as out-of-date.

18 Claims, 5 Drawing Sheets

| | Build | |
|---|---|---|
| | Convert proximity breaklines | Yes |
| | Exclude elevations less than | No |
| | Elevation | |
| | Exclude elevations greater than | No |
| | Elevation | |
| | Use maximum triangle length | No |
| | Maximum triangle length | |
| | Allow crossing breaklines | Yes |
| | Elevation to use | Use first breakline elevation at intersection |
| | Copy deleted drawing object data to definition | Yes |

U.S. PATENT DOCUMENTS

| | | | |
|---|---|---|---|
| 6,784,896 | B1 | 8/2004 | Perani et al. |
| 6,907,364 | B2 | 6/2005 | Poolla et al. |
| 6,910,001 | B2* | 6/2005 | Hammersley et al. .......... 703/2 |
| 6,912,692 | B1 | 6/2005 | Pappas |
| 6,915,211 | B2 | 7/2005 | Kram et al. |
| 6,965,945 | B2 | 11/2005 | Lin et al. |
| 7,002,573 | B2 | 2/2006 | Trotta et al. |
| 7,054,741 | B2 | 5/2006 | Harrison et al. |
| 7,123,258 | B2 | 10/2006 | Deny et al. |
| 7,164,883 | B2 | 1/2007 | Rappaport et al. |
| 7,181,363 | B2* | 2/2007 | Ratti et al. .................. 702/159 |
| 7,280,109 | B2 | 10/2007 | Hoppe |
| 7,283,134 | B2 | 10/2007 | Hoppe |
| 2001/0004726 | A1 | 6/2001 | Lambrecht |
| 2001/0013866 | A1 | 8/2001 | Migdal et al. |
| 2001/0049704 | A1 | 12/2001 | Hamburg et al. |
| 2002/0042702 | A1 | 4/2002 | Calvert et al. |
| 2002/0085748 | A1 | 7/2002 | Baumberg |
| 2002/0161469 | A1 | 10/2002 | Faulkner et al. |
| 2003/0046099 | A1 | 3/2003 | Lamont et al. |
| 2003/0112235 | A1 | 6/2003 | Grace |
| 2003/0158668 | A1 | 8/2003 | Anderson |
| 2003/0216949 | A1 | 11/2003 | Kram et al. |
| 2003/0218609 | A1 | 11/2003 | Maillot et al. |
| 2004/0004611 | A1 | 1/2004 | Komornicki et al. |
| 2004/0019455 | A1 | 1/2004 | Khanna et al. |
| 2004/0070586 | A1 | 4/2004 | Taubin |
| 2004/0075659 | A1 | 4/2004 | Taubin |
| 2004/0076279 | A1 | 4/2004 | Taschereau |
| 2004/0090438 | A1 | 5/2004 | Alliez et al. |
| 2004/0215428 | A1 | 10/2004 | Bras et al. |
| 2004/0249654 | A1 | 12/2004 | Sohl, III et al. |
| 2005/0013467 | A1 | 1/2005 | McNitt |
| 2005/0031197 | A1* | 2/2005 | Knopp ....................... 382/154 |
| 2005/0034075 | A1 | 2/2005 | Riegelman et al. |
| 2005/0068315 | A1* | 3/2005 | Lewis et al. ................. 345/419 |
| 2005/0104884 | A1 | 5/2005 | Iwata et al. |
| 2005/0209895 | A1 | 9/2005 | Coleou |
| 2006/0235620 | A1 | 10/2006 | Lecerf |
| 2007/0021951 | A1 | 1/2007 | Lee Seislink |
| 2007/0219765 | A1 | 9/2007 | Calvert |

OTHER PUBLICATIONS

Schneider, J. and R. Westermann, "GPU-Friendly High-Quality Terrain Rendering." Journal of the WSCG. vol. 14. © 2006. http://wwwcg.in.tum.de/Research/data/Publications/wscg06.pdf.*

R. J. Fowler and J. J. Little. "Automatic extraction of irregular network digital terrain models." In Proc. ACM SIGGraph '79, pp. 199-207. © 1979.*

P. Lindstrom and V. Pascucci. "Visualization of large terrains made easy." In Proc. IEEE Visualization '01, pp. 363-370. © 2001.*

P. Lindstrom and V. Pascucci. "Terrain simplification simplified: A general framework for view-dependent out-of-core visualization." IEEE Transactions on Visualization and Computer Graphics, 8(3):239-254. © 2002.*

D. Koller, P. Lindstrom, W. Ribarsky, L.F. Hodges, N. Faust, and G.A. Turner. "Virtual GIS: A real-time 3D geographic information system." In Proc. IEEE Visualization '95, pp. 94-100. © 1995.*

M. Suter and D. Nuesch. "Automated generation of visual simulation databases using remote sensing and GIS." In IEEE Visualization '95, pp. 86-93. © 1995.*

The Voronoi Web Site 1990-1995. http://www.voronoi.com/pubs_1990.htm. Printed on May 28, 2007.*

Ron House et al., Special Edition Using AutoCAD 2000. © 2000. pp. iii-xi, 130-143.*

William Stallings, Operating Systems: Internals and Design Principles, $3^{rd}$ Ed. © 1998. pp. 377-387.*

Giordan et al. "Using Adobe Photoshop 5", Jul. 1998, published by Que, copyright 1998, pp. 128, 130-131, 346-351, 361.

Blatner et al. "Essential Photoshop 6 Tips", Aug. 13, 2001, via AdobePress www.adobepress.com/articles/printerfriendly.asp?p=22789, article courtesy of PeachPit Press.

Schoenstein, AutoCAD Land Development Desktop Release 2i, Springer Berlin / Heidelberg, 2001, vol. 2181/2001, pp. 39-42.

* cited by examiner

FIG. 3

| Build | |
|---|---|
| Convert proximity breaklines | Yes |
| Exclude elevations less than | No |
| Elevation | |
| Exclude elevations greater than | No |
| Elevation | |
| Use maximum triangle length | No |
| Maximum triangle length | |
| Allow crossing breaklines | Yes |
| Elevation to use | Use first breakline elevation at intersection |
| Copy deleted drawing object data to definition | Yes |

FIG. 4

| Data operations | | |
|---|---|---|
| | Use boundaries | Yes |
| | Use breaklines | Yes |
| | Use contour data | Yes |
| | Use DEM files | Yes |
| | Use point files | Yes |
| | Use point groups | Yes |
| | Use drawing object points | Yes |

| Edit operations | |
|---|---|
| Use add point | Yes |
| Use delete point | Yes |
| Use modify point | Yes |
| Use add line | Yes |
| Use delete line | Yes |
| Use swap edge | Yes |
| Use minimize flat faces | Yes |
| Use smooth surface | Yes |
| Use paste surface | Yes |
| Use raise/lower surface | Yes |
| Use import LandXML | Yes |
| Use import TIN | Yes |
| Use move point | Yes |

FIG. 6

| Definition Type | Parameters |
|---|---|
| Add point file | <Path and file name> |
| Import TIN (or LandXML) | <Path and file name> |
| Add point group | <Point group name> |
| Add DEM file | <Path and file name> |
| Add contour data | <Elevation range> |
| Add breakline | <Breakline type and description?> |
| Add boundary | <Boundary type and description> |
| Add point | <X,Y,Z coordinates> |
| Delete point | <X,Y coordinates> |
| Modify point | <X,Y,Z coordinates> |
| Add line | <Start X,Y coordinates>, <End X,Y coordinates> |

INTERACTIVE TRIANGULATED IRREGULAR NETWORK (TIN) SURFACES DESIGN

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 60/507,062, filed Sep. 29, 2003, by Christopher Eric Putnam and Mark W. Anderson, entitled "PARCEL DESIGN AND PLANAR TOPOLOGY,";

Provisional Application Ser. No. 60/507,080, filed Sep. 29, 2003, by Sreenadha B. Godavarthy, John M. Lewis, Thomas M Inzinga, Edward James Connor, Robert Bruce Todd, Jr., and Christopher Eric Putnam, entitled "SURFACE PROCESSING,";

Provisional Application Ser. No. 60/506,975, filed Sep. 29, 2003, by Kumud Dev Vaidya, Michael C. Rogerson, and Bhamadipati S. Rao, entitled "HORIZONTAL ALIGNMENT PROCESSING,"; and Provisional Application Ser. No. 60/506,974, filed Sep. 29, 2003, by Kumud Dev Vaidya, Michael C. Rogerson, and Bhamadipati S. Rao, entitled "VERTICAL ALIGNMENT PROCESSING,".

This application is related to the following co-pending and commonly-assigned patent applications, all of which are incorporated by reference herein:

U.S. patent application Ser. No. 10/954,526, filed on Sep. 29, 2004, by Christopher Eric Putnam and Mark W. Anderson, entitled "METHOD FOR DYNAMICALLY UPDATING A PLANAR TOPOLOGY", U.S. patent application Ser. No. 10/954,542, filed on Sep. 29, 2004, by Christopher Eric Putnam and Mark W. Anderson, entitled "METHOD FOR AUTOMATICALLY DISCOVERING HIERARCHICAL RELATIONSHIPS IN PLANAR TOPLOGIES", U.S. patent application Ser. No. 10/954,529, filed on Sep. 29, 2004, by Christopher Eric Putnam and Mark W. Anderson, entitled "INTERACTIVE METHOD FOR DESIGNING PARCELS", U.S. patent application Ser. No. 10/953,806, filed on Sep. 29, 2004, by Sreenadha B. Godavarthy and John M. Lewis, entitled "SURFACE SMOOTHING TECHNIQUES", U.S. patent application Ser. No. 10/953,245, filed on Sep. 29, 2004, by John M. Lewis, Robert Bruce Todd, Jr., Edward James Connor, and Christopher Eric Putnam, entitled "SURFACE CONSTRUCTION AUDIT TRAIL AND MANIPULATION", U.S. patent application Ser. No. 10/953,807, filed on Sep. 29, 2004, by Kumud Dev Vaidya, Michael C. Rogerson, and Bhamadipati S. Rao, entitled "INTERACTIVE CONSTRAINT BASED ALIGNMENT OBJECTS",

BACKGROUND OF THE INVENTION

1. Field of the Invention

The present invention relates generally to computer aided design (CAD) applications and geographic information systems (GIS), and in particular, to a method, apparatus, and article of manufacture for interactively editing a triangular irregular network (TIN) surfaces design.

2. Description of the Related Art

Computer aided design (CAD) applications are traditionally used for creating and editing drawings (e.g., maps, floor plans, and engineering designs). Further, CAD applications enable users to create/modify highly precise and accurate drawings/maps. Civil engineers and surveyors, for whom precision and accuracy are of primary importance, have adopted CAD applications to speed data input and perform computations for design projects.

Geographic information systems (GIS) have been traditionally used for spatial analysis and mapping and allow users to store, retrieve, manipulate, analyze, and display geographically referenced data. In this regard, an arc/node data model is commonly used in the GIS industry to identify a polygon that is used in land analysis. The arc/node model enables efficient data storage and users to easily determine whether an object is inside or outside a polygon. However, traditional GIS have been aimed at general cartography and broad land-use analysis, and not precision design for the construction and management of real-world projects. In this regard, the geometric precision that many engineers require has not been provided by traditional GIS systems. Some GIS companies have attempted to use complex databases to model real-world objects. However, such databases are still built on points, lines, and polygons and cannot store geometric objects used in traditional CAD applications (e.g., true arcs or road spirals).

Many organizations have used both CAD and GIS tools in different departments to utilize the different specific features available. Further, data from original CAD drawings may be frequently imported or digitized for use in the GIS mapping environment. However, because of the limitations of GIS systems and/or CAD systems, during such a transition, data connectivity, accuracy, and geometric precision are often lost. Accordingly, what is needed is an integrated solution that provides the functionality and tools of a GIS system with the precision and accuracy of a CAD application.

In an attempt to address the above concerns, industry specific components were built on top of the CAD engine to address specialized needs and eventually, an integrated solution was developed (e.g., Autodesk Map™ or Autodesk Land Desktop™ software available from the assignee of the present invention). Integrated solutions attempt to provide GIS functionality (e.g., multiuser editing, polygon overlay and analysis, topology, thematic mapping, etc.) within a CAD application and spatial database. The integrated solution allows civil engineers the ability to integrate the precision engineering tasks (from CAD) (e.g., site, roadway, and hydrological design) with the spatial analysis tools and data management of GIS.

Some integrated solutions may provide solutions for a particular industry or field. For example, one such integrated solution may be tailored to land development professionals to provide a base level of functionality for land planners, surveyors, civil engineers, drafters, and anyone who creates supporting documents. Such an application may also provide a streamlined ability to communicate survey data to and from the field and/or provide transportation and site engineering tools, and hydrology and hydraulics design and analysis.

Drawings in an integrated solution are often associated with one or more projects and a single project can contain one or more drawings. In this regard, land development professionals may desire to generate a model of the earth's surface for a project. Such a surface model is a three-dimensional geometric representation of the surface of an area of land. Surface models may be made up of triangles that are created when points that make up the surface data are connected. The triangles may form a triangulated irregular network (TIN) surface. A TIN line is one of the lines that makes up the surface triangulation. To create TIN lines, the surface points that are closest together may be connected.

The surface data used to obtain the surface points (i.e., for the surface map) may comprise random point data (points taken at a variety of elevations and coordinates), a selected group of points, coordinate geometry (COGO) points (e.g., COGO point data stored in an external database 110), or points imported from a file. Alternatively, coordinates from blocks or lines at elevations in a drawing may be used.

In addition to points, surfaces may also be built from DEM files (Digital Elevation Models), contour, breakline, and boundary data. The vertices of a contour may be used as surface points, or the contours may be treated as breaklines that prevent triangulation lines from crossing the contours.

To build a surface accurately, more information than points and contours must be provided. For example, to prevent surface triangulation across features such as roads or stream, breaklines may be defined. Breaklines are constraint lines used by the model that represent abrupt changes in the surface. TIN lines may be drawn to and from breakline vertices, but they do not cross the breakline. By including boundaries in the surface definition, a user can control how the surface extends to its outer limits, and internal areas may be hidden to prevent triangulation from occurring.

In addition to the above, when editing/manipulating a surface, many operations may be conducted by a user. However, when an edit is made, or when data defining a TIN surface is made, the updates to the TIN surface may not be reflected in the display of the surface immediately. In this regard, the prior art systems may require a user to maintain knowledge of which data defines a TIN surface and if such data is changed, the user must manually elect to update the TIN surface. Thus, prior art systems lack automation in updating TIN surfaces and lack flexibility in allowing the user to determine if and when such automation should occur.

SUMMARY OF THE INVENTION

One or more embodiments of the invention provide a technique for dynamically updating a TIN surface when edits are made. If defining data is changed, the surface may be automatically rebuilt, with all graphical displays updated appropriately. Alternatively, if defining data is changed, the surface may merely be flagged as out-of-date. Whether the surface is automatically rebuilt or flagged as out-of-date may be depend on whether an automatic rebuild option (that may be selectable by a user) is toggled on/off.

BRIEF DESCRIPTION OF THE DRAWINGS

Referring now to the drawings in which like reference numbers represent corresponding parts throughout:

FIG. 3 illustrates an expanded build category section for defining options for definition items in accordance with one or more embodiments of the invention;

FIG. 4 illustrates an expanded Data Operations category window for defining options for definition items in accordance with one or more embodiments of the invention;

FIG. 5 illustrates an expanded Edit Operations category window for defining options for definition items in accordance with one or more embodiments of the invention;

FIG. 6 illustrates an enlarged view of the definition list section for surface edit operations in accordance with one or more embodiments of the invention.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
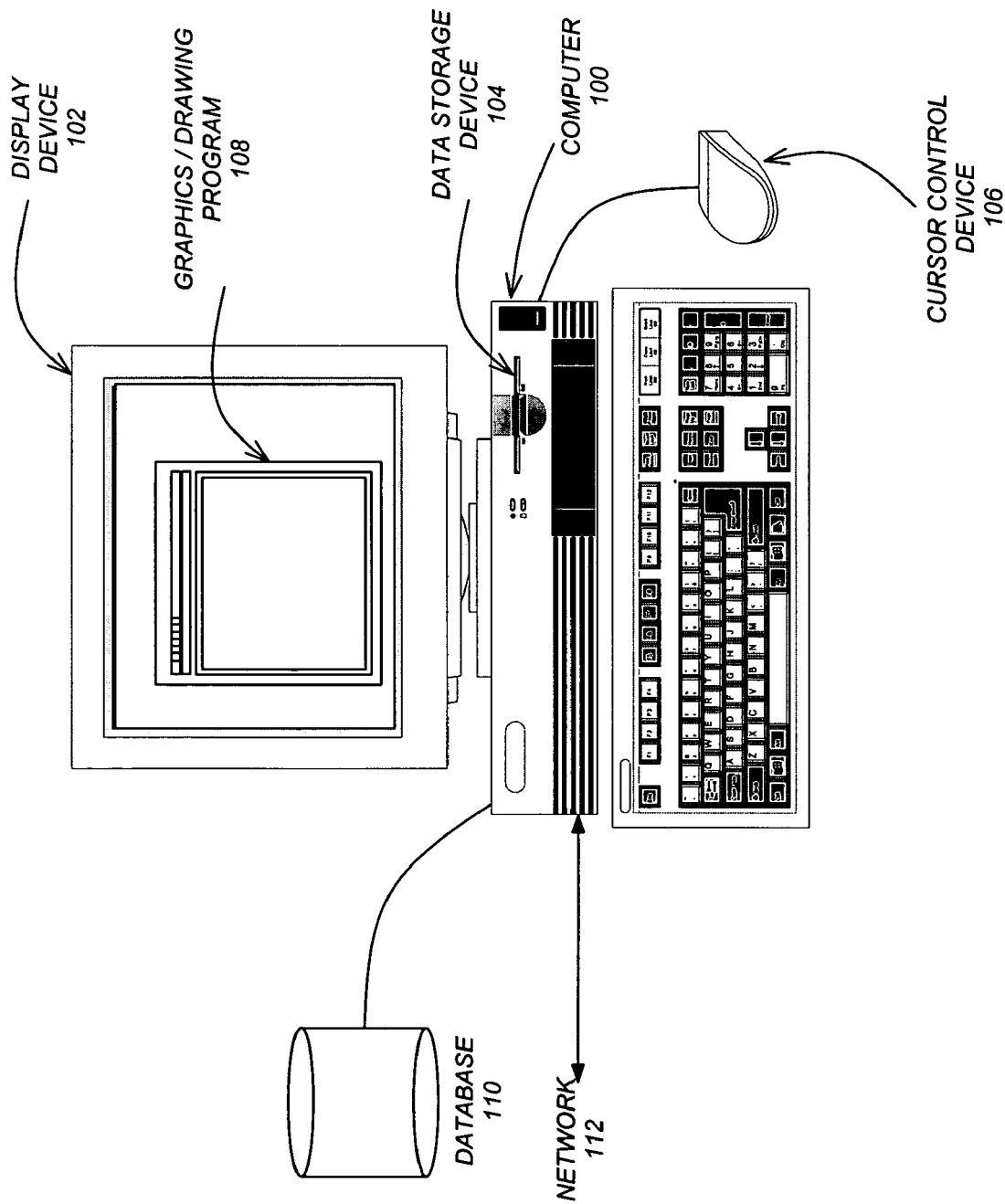
FIG. 1 is an exemplary hardware and software environment used to implement one or more embodiments of the invention.

FIG. 1 is an exemplary hardware and software environment used to implement one or more embodiments of the invention. Embodiments of the invention are typically implemented using a computer 100, which generally includes, inter alia, a display device 102, data storage devices 104, cursor control devices 106, and other devices. Those skilled in the art will recognize that any combination of the above components, or any number of different components, peripherals, and other devices, may be used with the computer 100.

One or more embodiments of the invention are implemented by a computer-implemented graphics program 108 (e.g., a CAD program), wherein the graphics program 108 is represented by a window displayed on the display device 102. Generally, the graphics program 108 comprises logic and/or data embodied in or readable from a device, media, carrier, or signal, e.g., one or more fixed and/or removable data storage devices 104 connected directly or indirectly to the computer 100, one or more remote devices coupled to the computer 100 via a data communications device, etc. Further, the graphics/drawing program 108 may utilize a database 110 such as a spatial database.

Computer 100 may also be connected to other computers 100 (e.g., a client or server computer) via network 112 comprising the Internet, LANs (local area network), WANs (wide area network), or the like. Further, database 110 may be integrated within computer 100 or may be located across network 112 on another computer 100 or accessible device.

Those skilled in the art will recognize that the exemplary environment illustrated in FIG. 1 is not intended to limit the present invention. Indeed, those skilled in the art will recognize that other alternative environments may be used without departing from the scope of the present invention. Accordingly, FIG. 1 illustrates an integrated CAD and GIS system that combines the traditional capabilities of CAD and GIS tools with common spatial management features. In this regard, such an integrated solution enables the use of true geometry, precision, powerful creation and editing tools, and drawing and document production of a CAD system in addition to the GIS capabilities for polygons, topology, overlay analysis, seamless database use, and thematic mapping. Further, single or multiple users may integrate their workflow using such a system.

Software Embodiments

As described above, one or more embodiments of the invention is implemented in an integrated CAD/GIS system. The invention provides for updating a TIN surface when edits are made.

Edit Operations

As described above, a surface in a CAD/GIS application 108 may be edited/modified. In this regard, various surface edit operations may be conducted. Table 1 illustrates some of the various edit operations permitted by specific surface types.

TABLE 1

Edit Operations by Surface Type

| Property | TIN Surface | TIN Vol. Surface | Grid Surface | Grid Vol. Surface |
|---|---|---|---|---|
| Add point | Yes | Yes | Yes | Yes |
| Delete point | Yes | Yes | Yes | Yes |
| Modify point | Yes | Yes | Yes | Yes |
| Add line | Yes | Yes | No | No |
| Delete line | Yes | Yes | Yes | Yes |
| Swap edge | Yes | Yes | No | No |
| Minimize flat faces | Yes | Yes | No | No |
| Non-destructive breakline | Yes | Yes | No | No |
| Smooth surface | Yes | No | No | No |
| Paste surface | Yes | No | No | No |
| Raise/lower surface | Yes | No | Yes | No |
| Import LandXML | Yes | No | Yes | Yes |
| Import TIN | Yes | No | No | No |
| Import DEM | No | No | No | No |

The following description summarizes some of the commands/operations from the above table that are available to edit a surface. The Add Line command adds a new TIN line to an existing surface. Similarly, the Delete Line command, deletes TIN lines from a surface. The Swap Edge command changes the direction of two triangle faces in the surface model so that the triangle edges match ridges or swales, for example. The Add Point command adds points directly to the surface model and the Delete Point command deletes points from a surface to remove inaccurate or unnecessary data. The Modify Points command changes the elevations of single or multiple surface points. The Move Point command moves an existing surface point to a new location and then updates the surface triangulation.

The Non-destructive Breaklines command creates a non-destructive breakline from an open or closed polyline. The Minimize Flat Faces command checks each contour in the surface contour data for any triangles that have either three points on the same contour or three points at the same elevation. The Raise/Lower Surface command changes the surface elevations by adding or subtracting an amount from the existing elevation of all the surface points.

The Smooth Surface command displays a smooth surface dialog for smoothing a surface. The Paste Surface command pastes a selected surface, into the current surface.

Edit History

In the prior art, when a surface was built (triangulated), surface points were extracted from the source data, triangulated, and then an edit history was applied to the triangulation. However, the build process was always in this order. In other words, the adding/removing of data and the sequence of editing was never applied in the original creation order.

In accordance with one or more embodiments of the invention, the build process is incremental. Further, the build process is dynamic and automatic. When data is added or the surface is edited, the surface is updated; when data is removed, the surface is rebuilt.

A definition list provides a sequential list of all operations performed on the surface in its current state. One can edit the definition list by toggling on/off a definition item, or deleting the item from the list. When definition items are toggled off, the surface is updated, but the surface still has a reference to the definition item. If the definition item is removed from the list, the definition item data is permanently removed from the surface.

Figure 2:
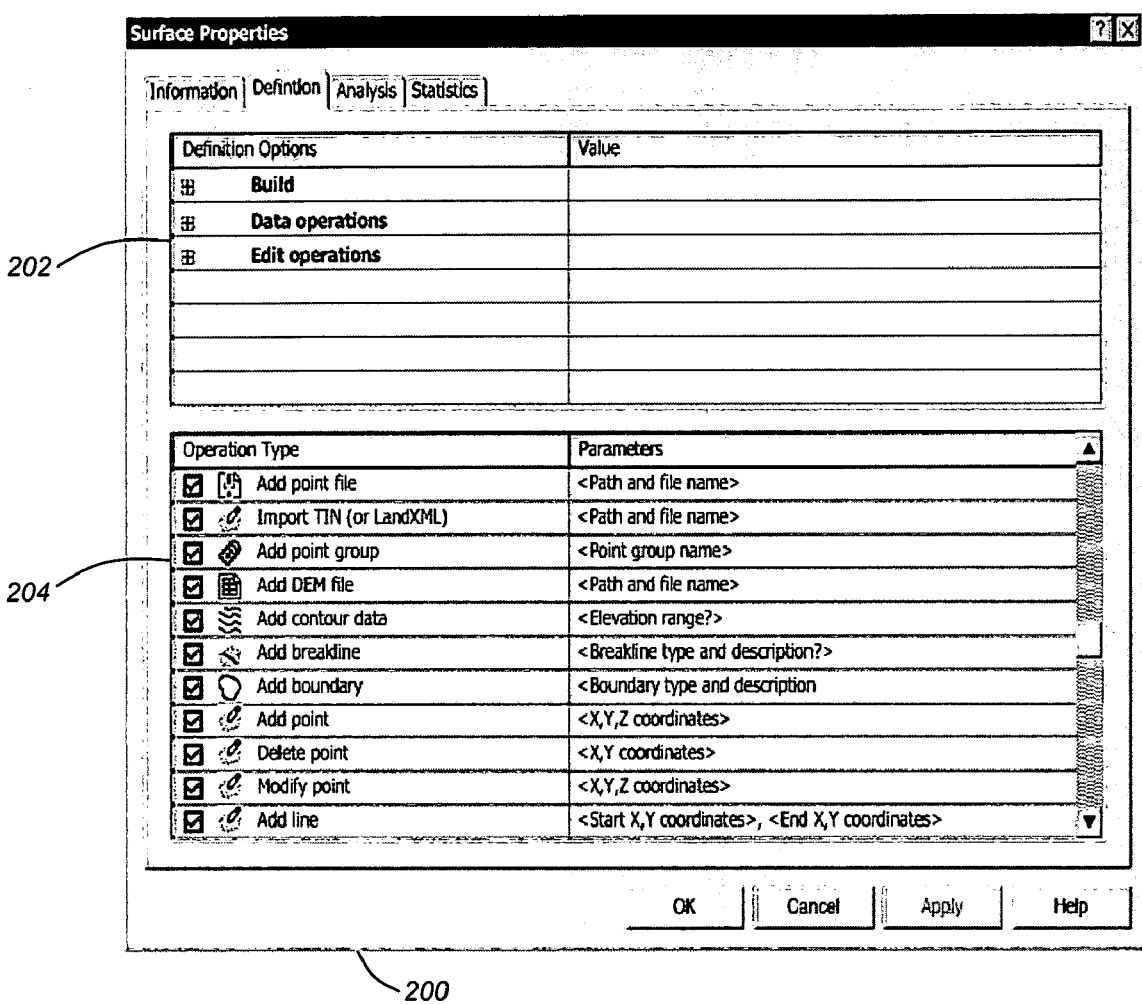
FIG. 2 illustrates a graphical user interface window presented to the user to define definition items in accordance with one or more embodiments of the invention.

To toggle on/off or remove surface definition terms, a graphical user interface window may be presented to the user. In the window, a surface definition may always be listed in the order the definition items were added when the surface was built/edited. FIG. 2 illustrates a graphical user interface window presented to the user to define definition items in accordance with one or more embodiments of the invention. There are two primary areas of the interface window 200—definition options section 202 and definition list section 204. Definitions options section 202 allows the user to define/specify options in various categories—build, data operations, and edit operations. As illustrated in FIG. 2, each of these categories are in a contracted mode as indicated by the "+" icon adjacent to each category listing in section 202. By selecting the "+" icon, each category may be expanded to provide further options.

The build category allows the user to define/specify various property values that occur when building a surface. FIG. 3 illustrates an expanded build category section in accordance with one or more embodiments of the invention. As illustrated in FIG. 3, when building a TIN surface, the user may determine whether or not to convert proximity breaklines to standard breaklines. Further, the user may elect whether point elevations less than (or greater than) a specified value are excluded and whether surface triangles that exceed a specified length are removed from the boundary of the surface. In addition, the user can determine whether crossing breaklines are corrected when they occur. If a breakline touches an existing breakline, a user can specify what elevation to use at the calculated point of intersection. In this regard, the X,Y coordinate location may be calculated and the elevation determined based on a user selected option that may include using a first breakline elevation at the intersection, using a last breakline elevation at the intersection, or using the average or the first and last breakline elevation at the intersection.

A last build category user option may provide for whether the drawing object data is to be copied to the surface definition if the drawing object data is deleted. When a surface boundary, breakline, or point group is added to a surface, the surface definition may store an identification for the object (referred to as an Object ID). If the drawing object, such as the original Polyline used to define the surface boundary, is deleted from the drawing, the coordinates of the Polyline vertices will be copied into the surface definition and saved. Therefore the surface boundary definition is not lost from the surface definition. However, if the user opts not to copy the surface definition upon drawing object data deletion, the surface boundary, breakline, or point group definition will be removed from the surface definition when the surface is rebuilt. The reason this occurs is due to the fact that the Object ID of the defining drawing object no longer exists in the drawing database.

The Data Operations category in an expanded form is illustrated in FIG. 4. The Data Operations category is used for selecting and deselecting a surface data type in the definition list. If "Yes" is specified in the value column 402, all definition items of that type will be checked in the definition list. If "No" is specified in value column 402, all definition items of that type are unchecked in the definition list. If the definition list section 204 contains mixed checked and unchecked items of a specific type, a combo box (in the value column 402) displays "Varies". "Varies" cannot be selected from such a combo box; and may only be displayed when the mixed checked/unchecked condition exists of a specific data type in the definition list section 204.

Table 2 illsutrates the various data operations options that are selectable by surface type in accordance with one or more embodiments of the invention.

TABLE 2

Data Operations Options by Surface Type

| Property | TIN Surface | TIN Vol. Surface | Grid Surface | Grid Vol. Surface |
|---|---|---|---|---|
| Boundaries | Yes | Yes | Yes | Yes |
| Breaklines | Yes | No | No | No |
| Contour data | Yes | No | No | No |
| DEM files | Yes | No | Yes | No |
| Point files | Yes | No | No | No |
| Point groups | Yes | No | No | No |
| Drawing object points | Yes | No | No | No |

The expanded Edit Operations category is displayed in FIG. 5 and is used for selecting and deselecting a surface operation type in the definition list. If "Yes" is specified in column 502, all definition items of that type will be checked in the definition list. If "No" is specified in column 502, all definition items of that type are unchecked in the definition list. If the definition list contains mixed checked and unchecked items of a specific type, a combo box in column 502 displays "Varies". "Varies" cannot be selected from a combo box in column 502; it is only displayed when the mixed checked/unchecked condition exists of a specific data type (as set forth in the definition list selection 204).

The Definition list section 204 provides the list of operations used to edit a surface in accordance with one or more embodiments of the invention. The items in the definition list may always be displayed in the order they were performed in. FIG. 6 illustrates an enlarged view of the definition list section 204 of FIG. 2 in accordance with one or more embodiments of the invention.

The Definition list view 204 contains two columns: Definition/operation Type 602 and Parameters 604. The Definition Type column 602 contains a check box 606, item type icon 608, and the definition type 610. The Parameters column 604 contains information about the item type, such as path and file name if the item is a file.

The checkbox 606 is used to determine whether the particular listed definition/operation type 610 (represented by icon 608) is to be included/used during the edit operation. Accordingly, the data additions/surface manipulations are all remembered as a list 204 of atomic operations. The user can browse the definition list section 204 and toggle particular steps/edit operations on/off, or remove an operation. In this regard, the user can play back the surface to a previous (original) state, or back to its current state. Further, the user can compare the effects that individual operations may have on the surface by toggling them on/off in the definition list 204. Also, the user can toggle groups of operations on/off based on the options specified in definition options section 202.

Table 3 illustrates the items that may appear in the Definition list view 204 when added to a surface definition.

TABLE 3

Surface Definition List

| Operation Type | Operation Parameter |
|---|---|
| ☑ Add point group | <Point group name> |
| ☑ Add point file | <Path and file name> |
| ☑ Add breakline[s] | <Type and description> |
| ☑ Add contour data | <Elevation range> |
| ☑ Add boundary | <Type and description |
| ☑ Add DEM file | <Path and file name> |
| ☑ Add point | <X,Y,Z coordinates> |
| ☑ Delete point | <X,Y coordinates> |
| ☑ Modified point | <X,Y,Z coordinates> |
| ☑ Add line | <Start X,Y coordinates>, <End X,Y coordinates> |
| ☑ Delete line | <Start X,Y coordinates>, <End X,Y coordinates> |
| ☑ Swap edge | <Start X,Y coordinates>, <End X,Y coordinates> |
| ☑ Add Non-destructive breakline | <Description> |
| ☑ Minimize flat faces | <Number of faces removed> |
| ☑ Raise/Lower surface (points) | <Difference elevation> |
| ☑ Smooth surface | <Type an number of points> |
| ☑ Paste surface | <Surface name> |
| ☑ Import TIN | <Path and file name> |
| ☑ Import XML | <Path and file name> |

As described above, when the definition type check box 606 is checked, the definition item's data is in use within the surface definition. For example, when a point file is unchecked from the list, the surface points that originated from the point file are hidden and the surface triangulation is updated when the OK/Apply button is selected.

To permanently remove selected definition items (also removes its data from the surface definition), a "Remove From Definition" option may be selected from a definition item context menu. Such a definition item context menu may be displayed by positioning the cursor over a particular definition item and clicking the right mouse button. Alternatively, any other method for selecting a particular item may be used in accordance with one or more embodiments of the invention. Once removed, the selected definition may be permanently removed from the surface and cannot be toggled/selected from the definition list 204.

The icons 608 displayed in the definition list 204 may indicate or provide information about the particular item. For example, a particular "item modified" icon 612 may be displayed if a definition item has been modified after being added to the surface. Similarly, an "item not found" icon 614 may be displayed if a definition item cannot be found when a surface properties dialog has been initialized.

If a definition item in the list 204 has been checked, unchecked or removed, or if a definition item is displayed as Modified 612 or Not Found 614, the user may be informed via a dialog box (e.g., that the surface is out of date) and presented with the option to rebuild the surface and apply changes made, apply changes made to surface properties, except for definitions, or merely returning to another dialog, for example.

In view of the above, the definition list 204 presents a list of atomic surface edit operations that the user may elect to enable/disable on an individual/group basis.

Dynamic Update of TIN Surface

As described above, when edits are made, a TIN surface may be dynamically updated to reflect the edit operations. Alternatively, instead of dynamically updating the graphical display containing the drawing surface, the data may merely be flagged as out-of-date. TIN surfaces are made up of various objects/entities. When the objects/entities are modified, the surface (and/or display of the surface) may not be updated to reflect the changes. In the prior art, the user was forced to be aware of which objects/entities made up a surface and if one of the objects/entities changed, the user was forced to manually elect to rebuild the surface.

In the present invention, each surface has a link or reference to each object/entity that is part of the surface (or vice versa). When the object/entity changes, the surface object makes a determination regarding whether an automatic rebuild option is active or not. Depending on the status of the option, the surface may be automatically rebuilt to reflect the change or the surface may merely be flagged as out-of-date. Alternatively, the definition item/edit operation may be flagged as out-of-date.

For example, suppose that a line object is part of a surface. The user may elect to move the line (which may be recorded as a definition item/edit operation). In the prior art, the user would have to remember that the line was part of the surface and elect to rebuild the surface to account for the moved line. In the present invention, the surface maintains a link to the line object (or vice versa) such that when the line is moved, the surface may be automatically rebuilt to reflect the changed line. Alternatively, if the rebuild option is toggled off, the surface may be flagged as out-of-date to reflect that the surface needs to be updated.

FIG. 6 illustrates a graphical user interface that indicates whether or not a definition item/edit operation is out-of-date or not. "Item modified" icon 612 reflects if a definition/edit operation has been modified after being added to the surface (or if it has been added to the surface and the surface has not yet been updated to reflect the addition)(i.e., whether it has been flagged as out of date). The presence of icon 612 next to an edit operation in list 602 indicates that the edit operation has been modified. Alternatively, as described above, an entire drawing surface may be flagged as out-of-date and an appropriate icon or notation may be displayed to the user indicating such a status.

The ability to automatically update the graphical display or merely flag an item as out-of-date may be controlled by a user using an "automatic rebuild" option/toggle. If the automatic rebuild is toggled on, the surface is automatically and dynamically rebuilt whenever an edit operation occurs or is modified. However, if the automatic rebuild option is toggled off, the surface operation and/or the drawing surface may be flagged as out-of-date. In such a situation, the drawing/drawing surface may be updated to reflect the modification when the next rebuild occurs. Such a rebuild may be initiated by the user or upon another event initiated by the CAD/GIS system.

Logical Flow

Figure 7:
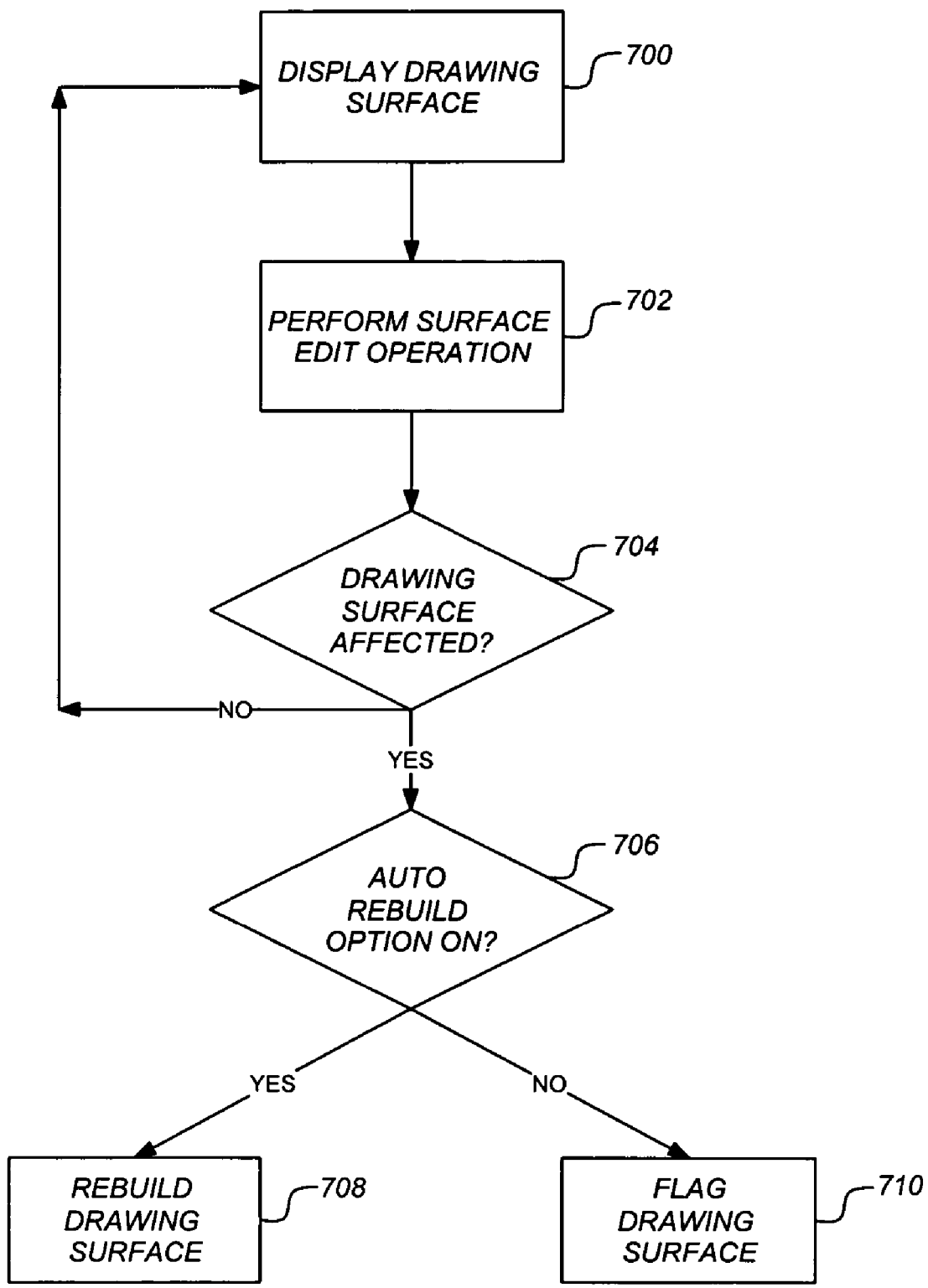
FIG. 7 is a flow chart illustrating the logical flow for updating a drawing surface when an edit operation is conducted in accordance with one or more embodiments of the invention.

FIG. 7 is a flow chart illustrating the logical flow for updating a drawing surface (e.g., a TIN drawing surface) when edits are made in accordance with one or more embodiments of the invention. At step 700, a drawing surface is displayed in a CAD/GIS application. At step 702, a surface edit operation is performed on the drawing surface. At step 704, a determination is made regarding whether the edit operation involved a change to an object/entity that is part of a drawing surface (or surface object). In other words, a determination is made regarding whether the drawing surface has been affected. If the edit has not affected the drawing surface, updates may not be required and the process continues at step 700. Such a determination (at step 704) may determine if a link exists between the object/entity that has been modified and the drawing surface. In other words, once an object/entity has been modified, the object/entity is examined to determine if a link to a surface object exists. If the link exists, the object/entity is part of a surface object and the surface object may need to be updated to reflect the changed object/entity. Depending on the automatic rebuild option, the surface object may/may not be updated to reflect the modification.

If the drawing surface has been affected, a determination is made regarding whether an automatic rebuild option is active (i.e., whether it is toggled on or off) at step 706. If the automatic rebuild option is active/on, the drawing surface is automatically and dynamically rebuilt to reflect the surface edit operation at step 708. One or more graphical displays that reflect the drawing surface may also be automatically and dynamically rebuilt if this option is active.

If the automatic rebuild option is inactive/off, the drawing surface is flagged as out-of-date at step 710. The flagging operation may also include the display of an icon indicating the surface edit operation has been modified after being added to the drawing surface. Such an icon may be displayed in a list of edit operations as described above. An icon may also be displayed on the graphical display of the drawing indicating that the display requires an update or does not accurately reflect the drawing surface. Further, the flagging may also allow the user to schedule (or may automatically schedule) a time/event for the drawing surface to be rebuilt. Thereafter, when the scheduling event occurs, the drawing surface is rebuilt to include the edit operation.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide the ability to update a drawing surface when edits are conducted.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and equivalents thereof.

What is claimed is:

1. A method for updating a drawing surface in a CAD/GIS computer application, comprising:
   displaying a drawing surface in a CAD/GIS application;
   performing a surface edit operation on the drawing surface;
   determining if an automatic rebuild option is active;
   dynamically and automatically rebuilding the drawing surface to reflect the surface edit operation if the automatic rebuild option is active; and
   flagging the drawing surface as out-of-date if the automatic rebuild option is inactive.

2. The method of claim 1, wherein the flagging comprises displaying an icon indicating the surface edit operation has been modified after being added to the drawing surface.

3. The method of claim 1, further comprising:
   scheduling the drawing surface for a rebuild if the drawing surface is flagged as out-of-date; and
   updating the drawing surface when the scheduled rebuild occurs.

4. The method of claim 1, wherein the drawing surface is a triangular irregular network (TIN) drawing surface.

5. The method of claim 1, further comprising dynamically and automatically updating graphical displays to reflect the edits made to the drawing surface when the drawing surface is rebuilt if the automatic rebuild option is active.

6. The method of claim 1, further comprising determining if the surface edit operation affects the drawing surface by examining a link between an object that has been edited and the drawing surface.

7. An apparatus for updating a drawing surface in a CAD/GIS computer application comprising:
(a) a computer system having a memory and a data storage device coupled thereto; and
(b) a GIS/CAD application executing on the computer, wherein the application is configured to:
  (i) display a drawing surface in a CAD/GIS application;
  (ii) perform a surface edit operation on the drawing surface;
  (iii) determine if an automatic rebuild option is active;
  (iv) dynamically and automatically rebuild the drawing surface to reflect the surface edit operation if the automatic rebuild option is active; and
  (v) flag the drawing surface as out-of-date if the automatic rebuild option is inactive.

8. The apparatus of claim 7, wherein the application is further configured to display an icon indicating the surface edit operation has been modified after being added to the drawing surface when the drawing surface is flagged.

9. The apparatus of claim 7, wherein the application is further configured to:
schedule the drawing surface for a rebuild if the drawing surface is flagged as out-of-date; and
update the drawing surface when the scheduled rebuild occurs.

10. The apparatus of claim 7, wherein the drawing surface is a triangular irregular network (TIN) drawing surface.

11. The apparatus of claim 7, wherein the application is further configured to dynamically and automatically update graphical displays to reflect the edits made to the drawing surface when the drawing surface is rebuilt if the automatic rebuild option is active.

12. The apparatus of claim 7, wherein the application is further configured to determine if the surface edit operation affects the drawing surface by examining a link between an object that has been edited and the drawing surface.

13. An article of manufacture comprising a program storage medium readable by a computer and embodying one or more instructions executable by the computer to perform a method for updating a drawing surface in an GIS/CAD computer system, the method comprising:
displaying a drawing surface in a CAD/GIS application;
performing a surface edit operation on the drawing surface;
determining if an automatic rebuild option is active;
dynamically and automatically rebuilding the drawing surface to reflect the surface edit operation if the automatic rebuild option is active;
flagging the drawing surface as out-of-date if the automatic rebuild option is inactive.

14. The article of manufacture of claim 13, wherein the flagging comprises displaying an icon indicating the surface edit operation has been modified after being added to the drawing surface.

15. The article of manufacture of claim 13, wherein the method further comprises:
scheduling the drawing surface for a rebuild if the drawing surface is flagged as out-of-date; and
updating the drawing surface when the scheduled rebuild occurs.

16. The article of manufacture of claim 13, wherein the drawing surface is a triangular irregular network (TIN) drawing surface.

17. The article of manufacture of claim 13, wherein the method further comprises dynamically and automatically updating graphical displays to reflect the edits made to the drawing surface when the drawing surface is rebuilt if the automatic rebuild option is active.

18. The article of manufacture of claim 13, wherein the method further comprises determining if the surface edit operation affects the drawing surface by examining a link between an object that has been edited and the drawing surface.

* * * * *